(12) United States Patent
Inatsune

(10) Patent No.: US 7,196,658 B2
(45) Date of Patent: Mar. 27, 2007

(54) WAVEFORM GENERATION METHOD, WAVEFORM GENERATION PROGRAM, WAVEFORM GENERATION CIRCUIT AND RADAR DEVICE

(75) Inventor: Shigeho Inatsune, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 160 days.

(21) Appl. No.: 10/506,991

(22) PCT Filed: Aug. 25, 2003

(86) PCT No.: PCT/JP03/10702

§ 371 (c)(1),
(2), (4) Date: Sep. 9, 2004

(87) PCT Pub. No.: WO2004/019496

PCT Pub. Date: Mar. 4, 2004

(65) Prior Publication Data

US 2005/0165567 A1 Jul. 28, 2005

(30) Foreign Application Priority Data

Aug. 26, 2002 (JP) ............................ 2002-244918

(51) Int. Cl.
*G01S 7/28* (2006.01)
(52) U.S. Cl. .................. 342/202; 342/203; 342/204; 342/195; 342/135; 342/132
(58) Field of Classification Search ........ 342/200–204, 342/175, 195, 118, 130–132, 134, 135
See application file for complete search history.

(56) References Cited

U.S. PATENT DOCUMENTS

| | | | | |
|---|---|---|---|---|
| 4,550,307 | A * | 10/1985 | Akashi et al. | 341/144 |
| 4,571,572 | A * | 2/1986 | Noda et al. | 341/126 |
| 5,151,661 | A | 9/1992 | Caldwell et al. | 327/107 |
| 6,219,017 | B1 * | 4/2001 | Shimada et al. | 345/88 |
| 6,252,567 | B1 * | 6/2001 | Budzelaar | 345/55 |
| 6,313,780 | B1 * | 11/2001 | Hughes et al. | 341/156 |
| 6,763,407 | B1 * | 7/2004 | Koyanagi et al. | 710/69 |
| 7,061,424 | B2 * | 6/2006 | Kuroda et al. | 342/70 |
| 2003/0114124 | A1 * | 6/2003 | Higuchi | 455/126 |
| 2005/0165567 | A1 * | 7/2005 | Inatsune | 702/66 |

FOREIGN PATENT DOCUMENTS

| | | |
|---|---|---|
| JP | 61-144930 | 7/1986 |
| JP | 134723/1990 | 11/1990 |
| JP | 06152285 A * | 5/1994 |
| JP | 11-168325 | 6/1999 |
| JP | 2002-156447 | 5/2002 |

OTHER PUBLICATIONS

Iwao Sagara, "Introduction to AD/DA Conversion Circuit", The Third Chapter "Basis of D/A Conversion" on p. 68 to p. 75, p. 80 to p. 81.

(Continued)

*Primary Examiner*—John B. Sotomayor
(74) *Attorney, Agent, or Firm*—Oblon, Spivak, McClelland, Maier & Neustadt, P.C.

(57) ABSTRACT

A conventional waveform generation circuit was required to increase a number of bits or a sampling rate for a D/A converter to enhance a precision of waveform shaping, and had a problem that a cost was increased. Therefore, as a method for enhancing the precision of waveform shaping, a quantization error of an output waveform is made smaller by controlling an output time interval of an output value from a D/A converter so as to make a difference in an output voltage between target waveform and output waveform smaller. As a result, even if the D/A converter has a small number of bits, the waveform can be generated at high precision. Also, this waveform generation method may be applied to modulation control of a radar apparatus, as a result, constituting a small and inexpensive modulation circuit for an oscillator.

26 Claims, 18 Drawing Sheets

OTHER PUBLICATIONS

S. A. Hovanessian, "Radar System Design & Analysis", Artech House, INC., p. 78 to p. 81.
Patent Abstracts of Japan, JP 11-168325, Jun. 22, 1999 (reference previously filed in Japanese language on Sep. 9, 2004).
Patent Abstracts of Japan, JP 61-144930, Jul. 2, 1986 (reference previously filed in Japanese language on Sep. 9, 2004).
U.S. Appl. No. 10/572,964, filed Mar. 21, 2006, Inatsune.

* cited by examiner

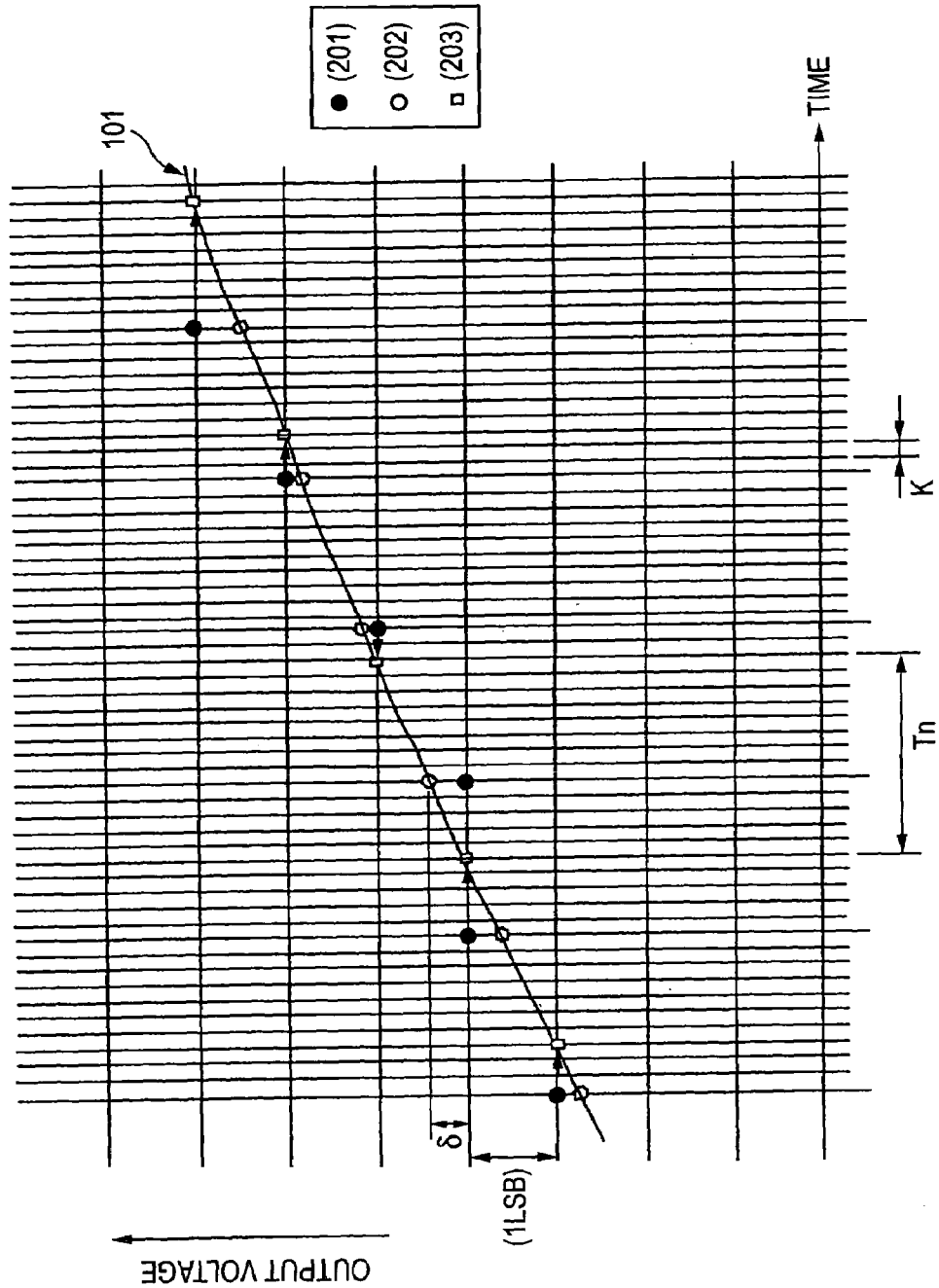

FIG. 7 (a)

| TIME MEMORY | |
|---|---|
| ADDRESS | DATA |
| 0000 | 0 |
| 0001 | T1 |
| 0002 | T2 |
| 0003 | T3 |
| 0004 | T4 |
| ⋮ | ⋮ |
| N - 1 | TN - 1 |
| N | TN |

| WAVEFORM MEMORY | |
|---|---|
| ADDRESS | DATA |
| 0000 | V0 |
| 0001 | V1 |
| 0002 | V2 |
| 0003 | V3 |
| 0004 | V4 |
| ⋮ | ⋮ |
| N - 1 | VN - 1 |
| N | VN |

2

BACKGROUND ART

US 7,196,658 B2

WAVEFORM GENERATION METHOD, WAVEFORM GENERATION PROGRAM, WAVEFORM GENERATION CIRCUIT AND RADAR DEVICE

TECHNICAL FIELD

The present invention relates to a waveform generation method, a waveform generation program, and a waveform generation circuit for generating a waveform in programmable manner, and a radar apparatus having the waveform generation circuit as a modulation circuit.

BACKGROUND ART

A conventional circuit for reproducing an analog waveform by converting a digital signal into an analog signal, including a D/A (Digital to Analog) converter for decoding and step-pulsing, and a post-filter (identical to a low pass filter), has been well known. This circuit involved a quantization error from a desired target waveform in a range from −½ LSB to +½ LSB (e.g., refer to Iwao Sagara, "Introduction to AD/DA Conversion Circuit, P.68 to P.75, P.80 and P.81).

FIG. 11 is a block diagram showing one example of the conventional waveform generation circuit. In FIG. 11, 1 denotes an address generator for generating the address value of a memory, and 2 denotes a waveform memory for storing waveform data. 3 denotes a D/A (Digital to Analog) converter for converting a digital value into an analog value in accordance with an output value of the waveform memory 2, and 4 denotes a low pass filter for removing high frequency components of output of the D/A converter 3 to make the waveform smoother. 5 denotes a timing controller for supplying necessary control signals such as a clock signal and an enable signal to the address generator 1 and the D/A converter 3. This waveform generation circuit may be employed as a speech synthesis unit by adding an amplifier for amplifying power and a speaker.

In FIG. 11, the waveform memory 2 preliminarily stores waveform data desired to generate waveform, the waveform data being arranged in time series. The timing controller 5 generates a control signal such as a trigger signal to output a memory address value to the address generator 1 at regular time intervals. The timing controller 5 generates a control signal such as a chip select signal required for memory output to the waveform memory 2, and outputs a trigger signal or a select signal required for D/A conversion to the D/A converter 3.

The address generator 1 outputs the address value in the order from the initial address of waveform data stored in the waveform memory 2 in synchronism with a trigger signal received from the timing controller 5 at regular time intervals. The waveform memory 2 outputs waveform data according to the address value output from the address generator 1. The D/A converter 3 outputs a voltage proportional to a value output from the waveform memory 2, if the value is set. The low pass filter (LPF) 4 removes a sampling noise produced in accordance with an output period of the D/A converter 3.

FIG. 12 shows the basic concept of a waveform generation method for use with the conventional waveform generation circuit. In FIG. 12, 101 is a target waveform to be generated, and 104 denotes a D/A output waveform. The conventional waveform generation circuit determined the output by performing a so-called quantization involving selecting a value of the D/A converter closest to a waveform value of analog quantity at a regular interval sampling time Ts, if the target waveform 101 was given. The D/A output waveform 104 represents the output voltage values in time series, which are supplied from the D/A converter 3 at regular intervals.

FIG. 13 is an enlarged view of FIG. 12. In FIG. 13, an output point 102 of the D/A converter 3 is selected at a value close to the target waveform, but a quantization error as large as ½ LSB at maximum occurs at the regular interval sampling time Ts, as compared with a transit point 103 of the target waveform at the same point of time. That is, the quantization error δ falls in a range from −½ LSB to +½ LSB.

FIG. 14 is a block diagram showing one example of the configuration of an FM-CW radar apparatus. Herein, 801 denotes a modulation circuit, 802 denotes an oscillator, 803 denotes a directional coupler, 804 denotes a transmission antenna, 805 denotes a reception antenna, 806 denotes a mixer, 807 denotes an amplifier, 808 denotes an A/D (Analog to Digital) converter, 809 denotes frequency analysis means, 810 denotes target detecting means, and 811 denotes distance/speed calculating means (e.g., refer to S. A. Hovanessian, "Radar System Design & Analysis", Artech House, INC., p.78 to p.81).

In FIG. 14, first of all, the modulation circuit 801 generates a frequency modulation (hereinafter referred to as FM (Frequency Modulation)) signal, which is sent to the oscillator 802. The oscillator 802 generates a high frequency signal modulated with the FM signal and the high frequency signal being distributed by the directional coupler 803 is sent to the transmission antenna 804 and the mixer 806. The transmission antenna 804 radiates a transmitting wave of the high frequency signal toward a target object in front of the radar apparatus. Herein, when the target object exists, a receiving wave (reflected wave) with a time lag is received by the reception antenna 805, and sent to the mixer 806. The mixer 806 generates a signal of frequency difference (hereinafter referred to as a beat signal) between this reflected wave and the transmitting wave distributed by the directional coupler 803. This beat signal is sent to the amplifier 807. The amplifier 807 amplifies the beat signal, and then sent to the A/D converter 808.

The A/D converter 808 converts the beat signal from analog to digital signal form, the beat signal in digital form is then sent to the frequency analysis means 809. The frequency analysis means 809 inputs the digitized beat signals and provides a frequency distribution (frequency spectrum) through the processing of FFT (Fast Frequency Transform) etc. The target detecting means 810 compares the frequency distribution with a threshold, and detects the target value as the largest one of the values beyond the threshold. The distance/speed calculating means 811 calculates the relative distance and relative speed of the target object based on a frequency picked up by the target detecting means 810.

FIG. 15 and FIGS. 16(a) and 16(b) are views for explaining how to calculate the relative distance and relative speed of the target object. FIG. 15 shows variations in the frequency, and FIGS. 16(a) and 16(b) show a frequency spectrum of the beat signal simply. In FIG. 15, 812 denotes a transmitting frequency of the FM-CW radar apparatus, and 813 denotes a receiving frequency.

First of all, the transmitting frequency 812 is linearly increased in an UP slope interval Tmu, and linearly decreased in a DOWN slope interval Tmd to transmit electric wave. Herein, it is supposed that a measuring object exists at the relative speed v and the relative distance R to the FM-CW radar apparatus. At this time, if the transmitting frequency is changed by $\Delta f$ at the light speed C [m/s] and the transmitting wavelength $\lambda$[m] in the time intervals Tmu and Tmd, the Doppler frequency fd is represented by a function (1). Herein, the distance frequency fr caused by a time difference between the transmitting frequency and the receiving frequency, which is proportional to the distance, is represented by a function (2). Also, the beat frequency fb1 in the Up slope interval Tmu and the beat frequency fb2 in the DOWN slope interval Tmd are represented by functions (3) and (4), respectively.

$$fd = 2 \cdot V/\lambda \qquad (1)$$

$$fr = (2R \cdot \Delta f)/(C \cdot Tm) \qquad (2)$$

$$fb1 = |fd - fr| \qquad (3)$$

$$fb2 = |fd + fr| \qquad (4)$$

Also, when the distance frequency fr is greater than the Doppler frequency fd, a function (5) holds.

$$2fr = fb1 + fb2 \qquad (5)$$

By the way, substituting the function (2) for the function (5), a function (6) for calculating the relative distance from the FM-CW radar apparatus to the target object is derived.

$$R = (C \cdot Tm) \cdot (fb1 + fb2)/(4 \cdot \Delta f) \qquad (6)$$

From the function (6), the distance to the target object is calculated from the beat frequency fb1 in the UP slope interval Tmu and the beat frequency fb2 in the DOWN slope interval Tmd. Also, if the distance frequency fr is calculated, the relative speed V is obtained from the functions (1), (3) and (4).

The conventional radar apparatus for measuring the distance with the FM modulation supplies a voltage of staircase shape to a voltage controlled oscillator to improve the distance measurement precision. At this time, the frequency measuring means measures an output frequency from the voltage controlled oscillator. The frequency measuring means measures the output frequency from the voltage controlled oscillator, corresponding to each voltage of staircase shape, and calculates an applied voltage for making the sweep speed invariable from this measured frequency. Control means operated the distance measurement by supplying this applied voltage to the voltage controlled oscillator at a predetermined interval. (e.g., refer to JP-A-2002-156447).

The conventional waveform generation circuit produced a quantization error of ½ LSB at maximum from the target waveform if the output control for the D/A converter is made at an equal time interval. Also, when a micro signal is dealt with, a periodical ripple noise occurred due to the quantization error of the D/A converter.

FIGS. 17(a) and 17(b) show how the ripple noise occurs due to the quantization error. FIG. 17(a) shows the relationship between the target waveform and the D/A output waveform, and FIG. 17(b) shows the relationship between the D/A output waveform and the output waveform of the low pass filter. For the simplified explanation, the target waveform is linear. 901 denotes a target waveform, 902 denotes a D/A output waveform output from the D/A converter 3 by quantizing the target waveform 901, and 903 denotes the output of the low pass filter 4 disposed at the latter stage of the D/A converter 3 and provided to remove the sampling noise.

As seen from FIG. 17(a), when the minimum step width of the quantization output is rough relative to the target waveform 901, the error between the output voltage of the D/A converter 3 and the target waveform is periodically greater. As a result, the output waveform is undulated as indicated by the output 903 of the low pass filter 4 in FIG. 17(b), so that a ripple noise of the low frequency that is the sampling frequency divided by an integer (¼, ⅕, etc.) appears superposed on the ideal target waveform.

Conventionally, it was required to increase the number of bits or the sampling frequency in the D/A converter to reduce this ripple noise, so that the cost was increased.

Also, the FM-CW radar apparatus for measuring the distance by applying the frequency modulation was required to make the high precision modulation control, but if the modulation signal has the superposed ripple noise, the beat signal as a difference between the transmitting wave and the receiving wave was distorted, causing the frequency spectrum to split or the other peak to arise at a position off the center of the frequency spectrum.

FIGS. 18(a), 18(b) and 18(c) are graphs showing the frequency spectrum of the beat signal for the FM-CW radar apparatus. 904 denotes a frequency spectrum of the beat signal in the UP slope or the DOWN slope. When the transmitting frequency is linearly changed, the beat signal is stable and has one frequency, and the peak value appears sharply as indicated by the frequency spectrum 904 in FIG. 18(a), and then the peripheral portion is at the side lobe level following a window function.

However, if the transmitting frequency is not correctly linear but has the superposed ripple noise, another peak appears at a position off the peak frequency by an amount of frequency according to the period of ripple noise.

FIG. 18(b) shows an instance where the frequency of ripple noise is near the resolution of spectrum, and the maximal point arises halfway on the spectrum of the beat signal. FIG. 18(c) shows an instance where the ripple frequency is higher and sufficiently away from the spectrum of the beat signal. In FIGS. 18(b) and 18(c), there is an obstacle to calculate the distance to the target object.

Conventionally, the D/A converter for use in the modulation circuit for the FM-CW radar apparatus was required to increase the number of bits or the sampling number to make the high precision control. Therefore, the cost was increased.

SUMMARY OF THE INVENTION

This invention has been achieved to solve the above-mentioned problems, and it is an object of the invention to provide a waveform generating method of high precision in which the ripple noise is suppressed.

Also, it is another object of the invention to provide a waveform generation circuit of small size and low cost and a radar apparatus having the waveform generation circuit in a modulation circuit.

According to one aspect of the invention, there is provided a waveform generation method including, for a desired target waveform output from a D/A converter, determining preliminarily an output value and an output timing of the D/A converter so that a voltage variation amount of the target waveform may be almost constant, and sequentially generating the output value from the D/A converter, based on the determined output value and output timing of the D/A converter.

According to another aspect of the invention, there is provided a waveform generation circuit including a time memory for storing an output time interval of the waveform output values preset discretely based on a desired target waveform, a timing controller for setting up the timing at which the D/A conversion of the waveform output value is performed, based on the output time interval stored in the time memory, and a D/A converter for performing the D/A conversion of the waveform output value according to the timing set up in the timing controller.

BRIEF DESCRIPTION OF DRAWINGS

FIG. 2 is a graph for explaining reduction of an error between target waveform and output waveform from the D/A converter according to the embodiment 1 of the invention.

FIGS. 7(a) and 7(b) are tables showing the memory contents according to the embodiment 3 of the invention.

BEST MODE FOR CARRYING OUT THE INVENTION

The present invention will be described below in detail with reference to the accompanying drawings.

Embodiment 1

FIGS. 1(a), 1(b), 1(c), 1(d) and 1(e) are a set of graphs showing a waveform generation method according to an embodiment 1 of this invention. In FIGS. 1(a), 1(b), 1(c), 1(d) and 1(e), 101 denotes a target waveform, 102 denotes a threshold voltage, 103 denotes an intersection point of the threshold voltage 102 and the target waveform 101, and 104 denotes a D/A output waveform.

Referring to FIGS. 1(a), 1(b), 1(c), 1(d) and 1(e), the operation of the embodiment 1 will be now described.

Figure 1A:
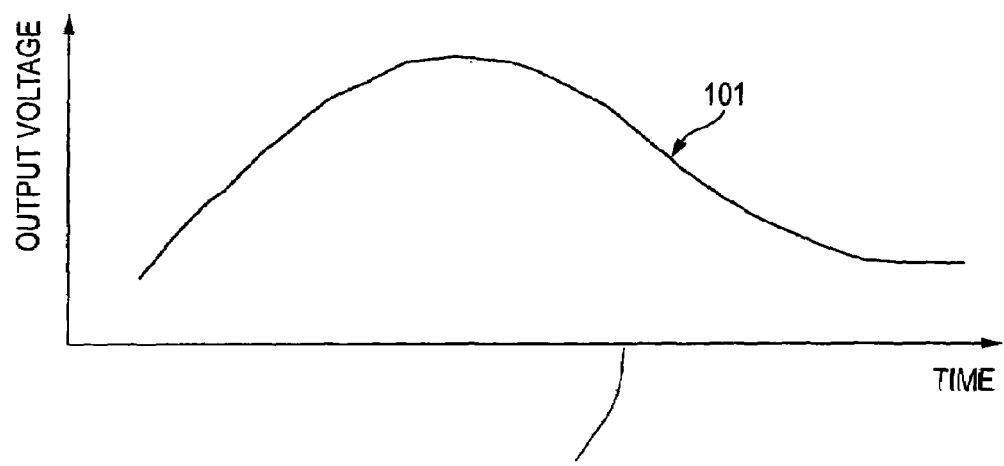
FIGS. 1(a), 1(b), 1(c), 1(d) and 1(e) are graphs for explaining a waveform generation method according to an embodiment 1 of this invention.

The target waveform 101 in FIG. 1(a) is an ideal waveform without error that is essentially desired to output, or a sufficiently finely approximated waveform. Suppose that the target waveform 101 is preliminarily given by another measurement means or calculation, not shown.

If the quantization interval (voltage direction) and the output time interval (time direction) are rough, the D/A converter cannot directly output the same waveform as the target waveform 101. Therefore, it is required to determine a combination of output values from the D/A converter to acquire an output waveform close to the target waveform 101. In the embodiment 1, an error between the output waveform and the target waveform 101 is reduced by making the output time interval of the D/A converter 3 variable.

A method for determining the output value of the D/A converter 3 and the output time interval will be described below.

Figure 1B:
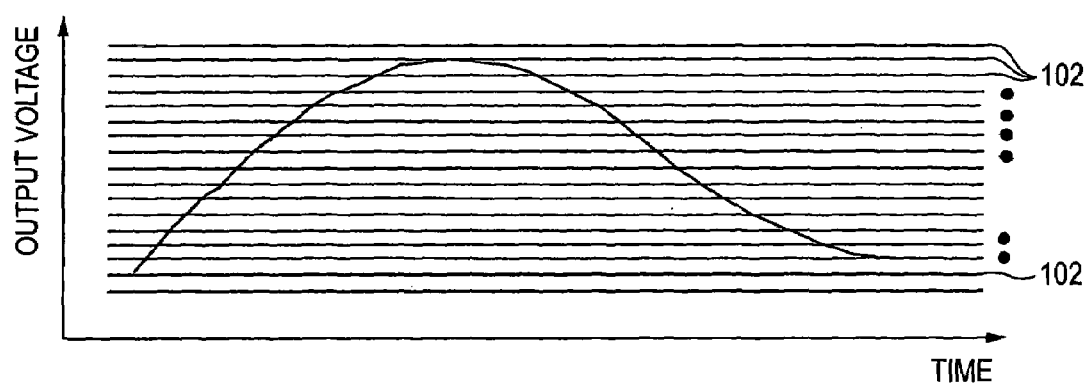
Figure 1C:
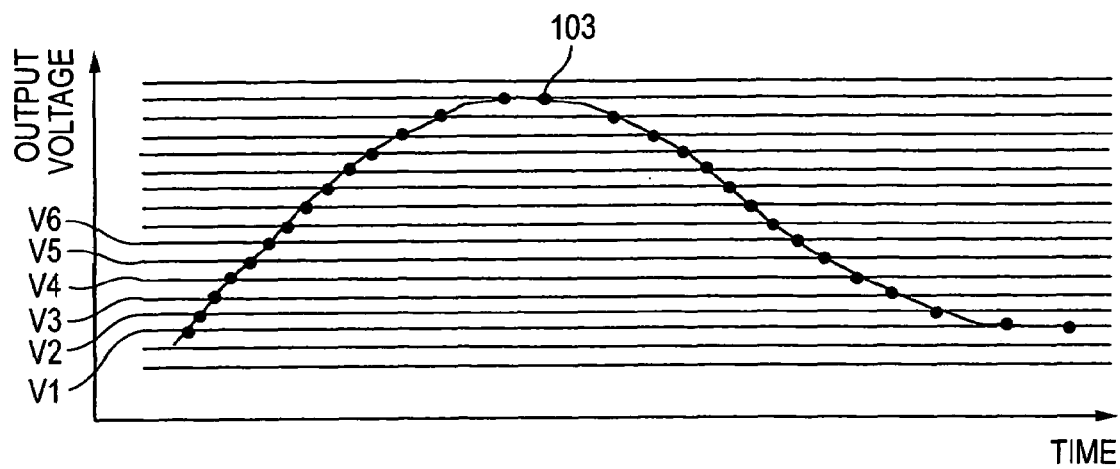

FIG. 1(b) shows how to divide the target waveform 101 based on plural threshold values 102 represented with the D/A converter 3 in use. The threshold voltages 102 are set up from the minimum value to the maximum value of the D/A converter 3 at a voltage step of the minimum resolution for the D/A converter 3. This minimum resolution is decided by the number of bits for the D/A converter 3. First of all, the output values of the D/A converter 3 are obtained from a plurality of intersection points 103 at which the threshold voltage 102 and the target waveform 101 are coincident, as shown in FIG. 1(c). The output values of the D/A converter 3 are v1, v2, ... vn in the order in which the intersection point 103 take place earlier over time.

Figure 1D:
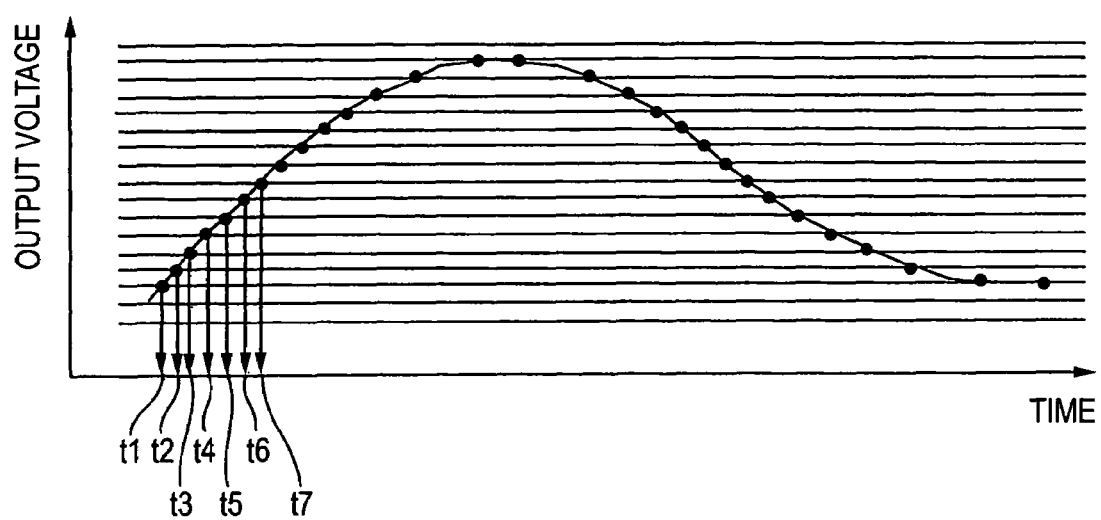

Then, the output time interval is decided. The output time is acquired by reading the value in the time axis direction from the intersection point 103, and deciding the time t1, t2, ... tn corresponding to v1, v2, ... vn, as shown in FIG. 1(d). The output time interval is defined such that the time difference is T1 from reference time to t1, T2 from t1 to t2, ... (omitted) and Tn from tn-1 to tn. Suppose that T1 to Tn are rounded off to the integral multiple of a clock period for a microcomputer.

Figure 1E:
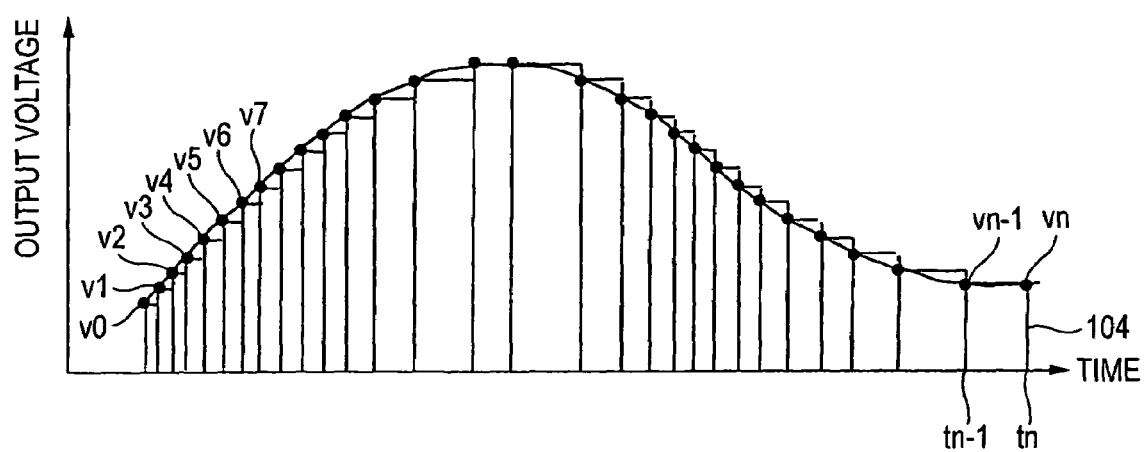

FIG. 1(e) is a graph for explaining how the D/A converter 3 makes the waveform output by the waveform generation method according to the embodiment 1. That is, the D/A output waveform 104 of the D/A converter 3 is changed in succession based on the decided output values v1, v2, ... vn and output time interval T1, T2, ... Tn. The value of the D/A converter 3 is kept constant until the D/A output waveform is changed. The D/A output waveform 104 of the D/A converter 3 is like a staircase, containing an error from the target waveform 101. However, a low pass filter for delaying the response purposely is disposed on the output side of the D/A converter 3, as a result, blunting a staircase-edge in the output of the D/A converter 3 (interpolating between the staircase like output values), so that the final output from the low pass filter is closer to the target waveform 101.

In the first embodiment 1, the output time interval is set longer when the waveform is changed slowly, or shorter when the waveform is changed sharply, so that an error from the target waveform can be reduced to the least.

FIG. 2 is an enlarged view of FIGS. 1(a), 1(b), 1(c), 1(d) and 1(e) showing how an error between the target waveform and the output of the D/A converter is reduced. In FIG. 2, 201 denotes an output point (at which a specific output voltage is obtained at a specific output time) of the D/A converter 3 in the conventional waveform generation circuit, 202 denotes a transit point of the target waveform at the same point of time as the output point 201, and 203 denotes an output point of the D/A converter 3 decided by the method of the embodiment 1. A quantization error δ between the output point 201 of the D/A converter 3 in the conventional waveform generation circuit and the transit point 202 of the target waveform is greater. However, in this embodiment 1, the position of output point is finely adjusted in the time direction at an integral multiple of the clock unit (clock interval) K of the microcomputer. At this time, the output time interval Tn is adjusted to the optimal interval to minimize a difference between the output point 203 of the D/A converter 3 and the output voltage at the transit point of the target waveform. As a result, a quantization error between the output point 203 of the D/A converter 3 and the output voltage at the transit point of the target waveform is reduced. In FIG. 2, the output point 203 of the D/A converter 3 roughly overlaps the transit point of the target waveform, so that the quantization error is extremely smaller.

Figure 3A:
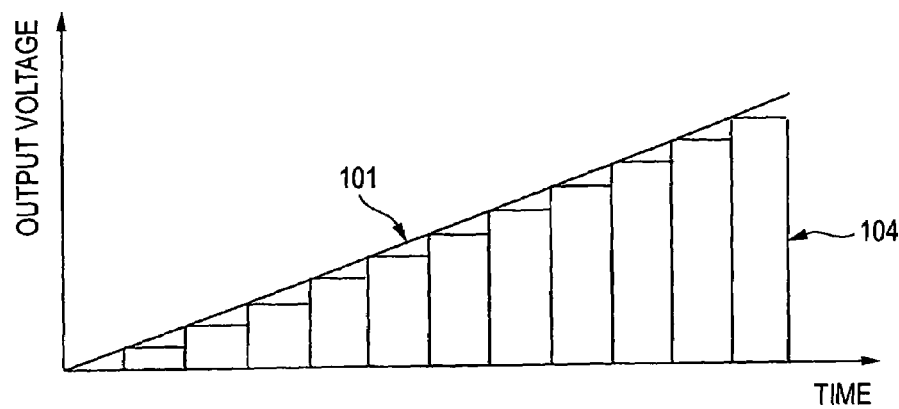
FIGS. 3(a), 3(b) and 3(c) are graphs for explaining the relationship between the gradient of target waveform and the output time interval according to the embodiment 1 of the invention.
Figure 3B:
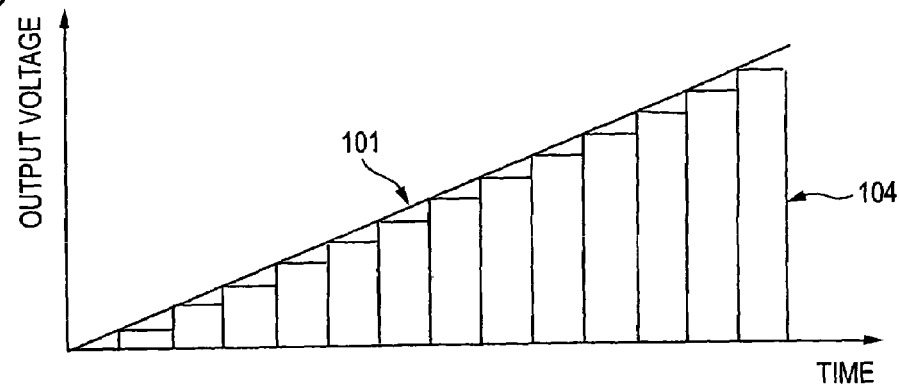
Figure 3C:
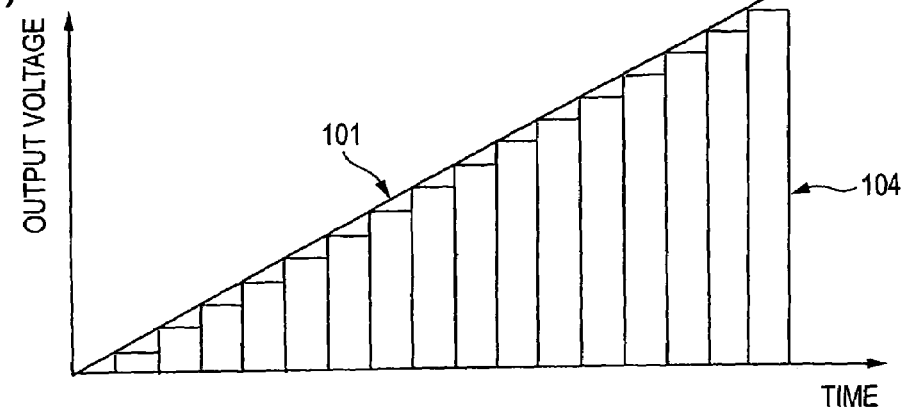

FIGS. 3(a), 3(b) and 3(c) shows the instances of the linear target waveform in the embodiment 1. The slope of target waveform is gentlest in FIG. 3(a), and gradually greater in FIG. 3(b) and FIG. 3(c). With the method of the embodiment 1, even if the slope is changed from FIG. 3(a) to FIG. 3(c), the output time is appropriately adjusted at an integral multiple of the clock unit to regulate the output time interval, as a result, roughly eliminating the error between the target waveform and the output waveform of the D/A converter. Especially when the target waveform is linear, the greatest effect is obtained.

According to this embodiment, the quantization error of the D/A converter is smaller by changing the output time interval between the output points of the D/A converter than where the output interval is equal over time, so that the ripple noise of low frequency likely to occur with the micro signal is suppressed.

Embodiment 2

Figure 4:
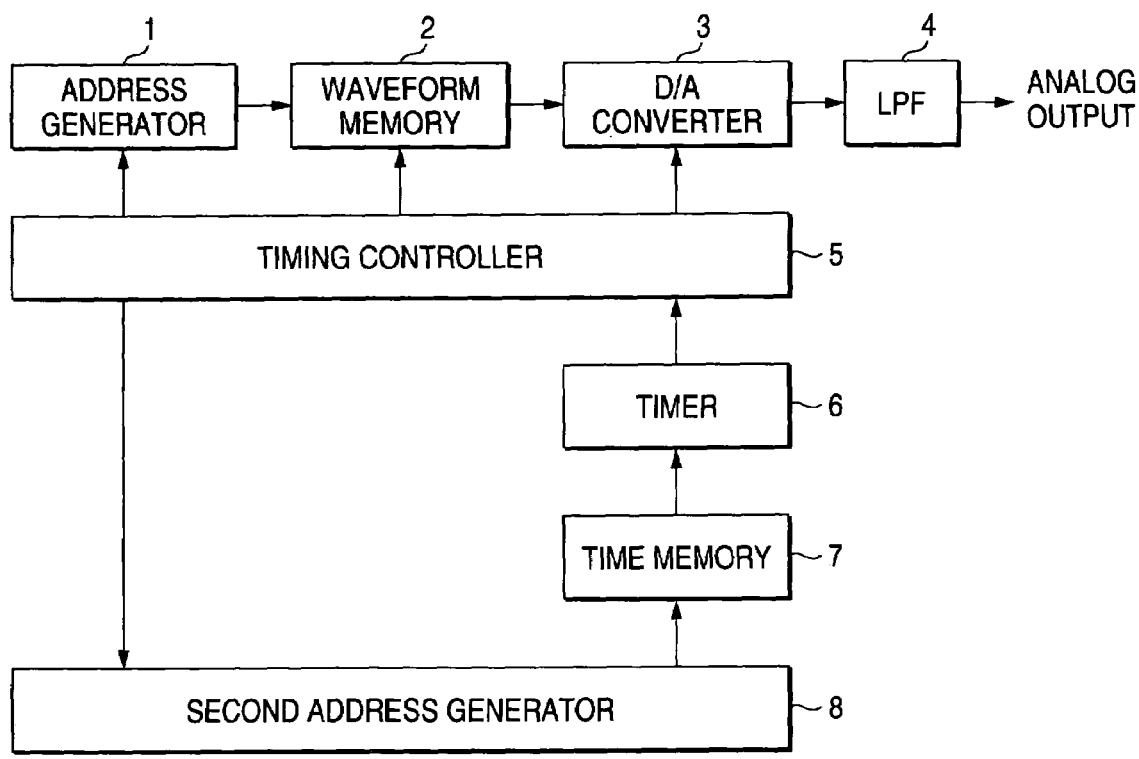
FIG. 4 is a block diagram showing the configuration of a waveform generation circuit according to an embodiment 2 of the invention.

FIG. 4 is a block diagram showing the configuration of a waveform generation circuit according to an embodiment 2 of this invention. In FIG. 4, 1 denotes an address generator for generating the address value of a waveform memory, 2 denotes a waveform memory for storing waveform data, 3 denotes a D/A converter for converting a digital value into an analog value in accordance with an output value of the waveform memory 2, 4 denotes a low pass filter (LPF) for removing high frequency components of output of the D/A converter 3 to make the waveform smooth, 5 denotes a timing controller for supplying necessary control signals such as a clock signal and an enable signal to the address generator 1 and the D/A converter 3, 6 denotes a timer for triggering the timing controller 5, 7 denotes a time memory for storing the time interval data, and 8 denotes a second address generator for generating the address value of the time memory 7.

Referring to FIG. 4, the operation of the embodiment 2 will be described below.

In FIG. 4, the output voltage values v1 to vn set discretely as shown in the embodiment 1 are preliminarily stored in time series in the waveform memory 2. Also, the time memory 7 preliminarily stores the timer values corresponding to the output time intervals T1 to Tn as shown in the embodiment 1, for example, the count number of a reference clock. The timing controller 5 generates a control signal such as a trigger signal to output a memory address value to the address generator 1 and the second address generator 8 and outputs a trigger signal or select signal required for the D/A conversion to the D/A converter 3.

First of all, the timing controller 5 applies a trigger signal to the second address generator 8. Then, the second address generator 8 outputs the address value in the order from the initial address of the timer value stored in the time memory 7. From the time memory 7, the timer value is read according to the address value received from the second address generator 8, and set to the timer 6. The timer 6 supplies the trigger signal to the timing controller 5 at an interval according to the output time intervals T1 to Tn indicated by the set timer value. The timing controller 5 sends the trigger signal to the address generator 1, the waveform memory 2 and the D/A converter 3 in synchronism with the trigger signal received from the timer 6.

The address generator 1 outputs the address value in the order from the initial address of waveform data stored in the waveform memory 2 in synchronism with the trigger signal. The waveform memory 2 outputs waveform data in synchronism with the trigger signal, and sets it to the D/A converter 3. The D/A converter 3 outputs a voltage in proportion to the set value from the waveform memory 2 in synchronism with the trigger signal. The low pass filter 4 removes a sampling noise produced in accordance with an output period of the D/A converter 3. The waveform generation method as shown in the embodiment 1 is implemented by sending the trigger signal from the timing controller 5 to the second address generator 8 again, and repeating the series of operations.

With this embodiment, the output time interval is arbitrarily set in a clock unit, an error between the target waveform and the output waveform is suppressed below the quantization error of ½ LSB produced with the conventional method for using the D/A converter, whereby it is unnecessary to take a great number of bits in the D/A converter. That is, the output waveform is generated at high precision, employing the inexpensive D/A converter with a smaller number of bits.

Embodiment 3

Figure 5:
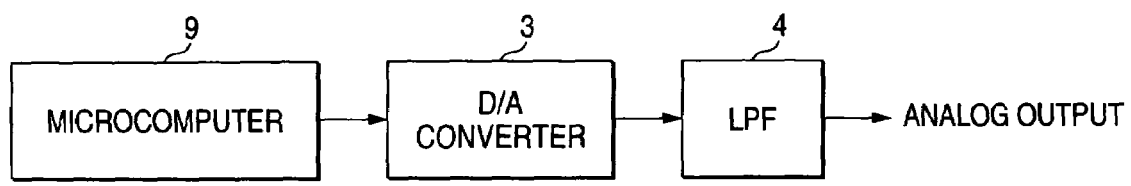
FIG. 5 is a block diagram showing the configuration of a waveform generation circuit according to an embodiment 3 of the invention.

FIG. 5 is a block diagram showing the configuration of a waveform generation circuit according to an embodiment 3 of the invention. In FIGS. 5, 3 and 4 are the same as in the embodiment 2. 9 denotes a microcomputer having an I/O for interface with the D/A converter 3, and a timer circuit for correctly setting up an interrupt generation time according to the timer value. In an internal memory of the microcomputer 9, the output voltage value of the D/A converter 3 and the timer value corresponding to the output time interval are stored.

Herein, a group of waveform generation features comprises the address generator 1, the waveform memory 2, the timing controller 5, the timer 6, the time memory 7, and the second address generator 8 in the embodiment 2 are internally stored as a software processing in the microcomputer 9, as a result, allowing the same operation as the embodiment 2 to be performed.

Figure 6:
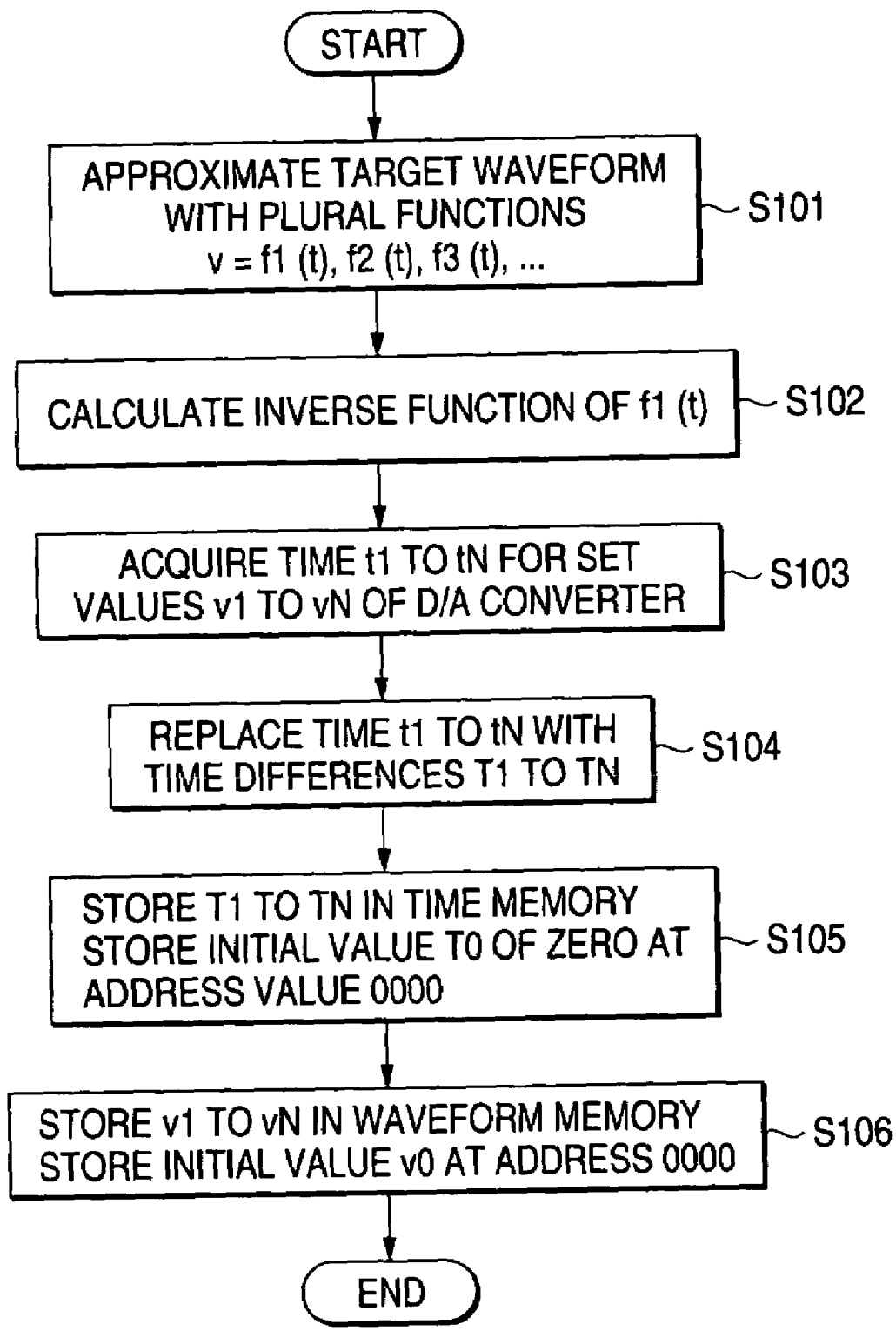
FIG. 6 is a flowchart showing a data creation processing procedure according to the embodiment 3 of the invention.

The software processing is divided into two parts, including a data creation processing for storing data in the time memory 7 and the waveform memory 2, and a waveform output processing. FIG. 6 shows the data creation processing.

Figure 8:
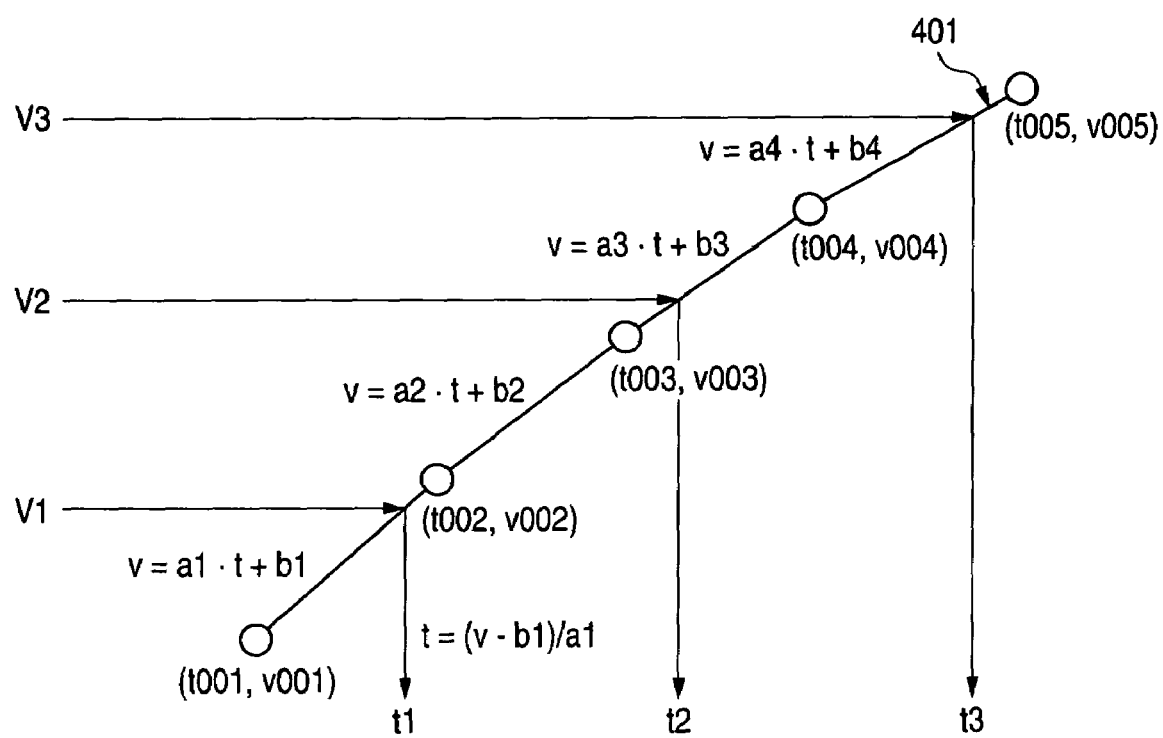
FIG. 8 is a diagram for explaining a way of setting up the output time interval from the target waveform according to the embodiment 3 of the invention.
Figure 9:
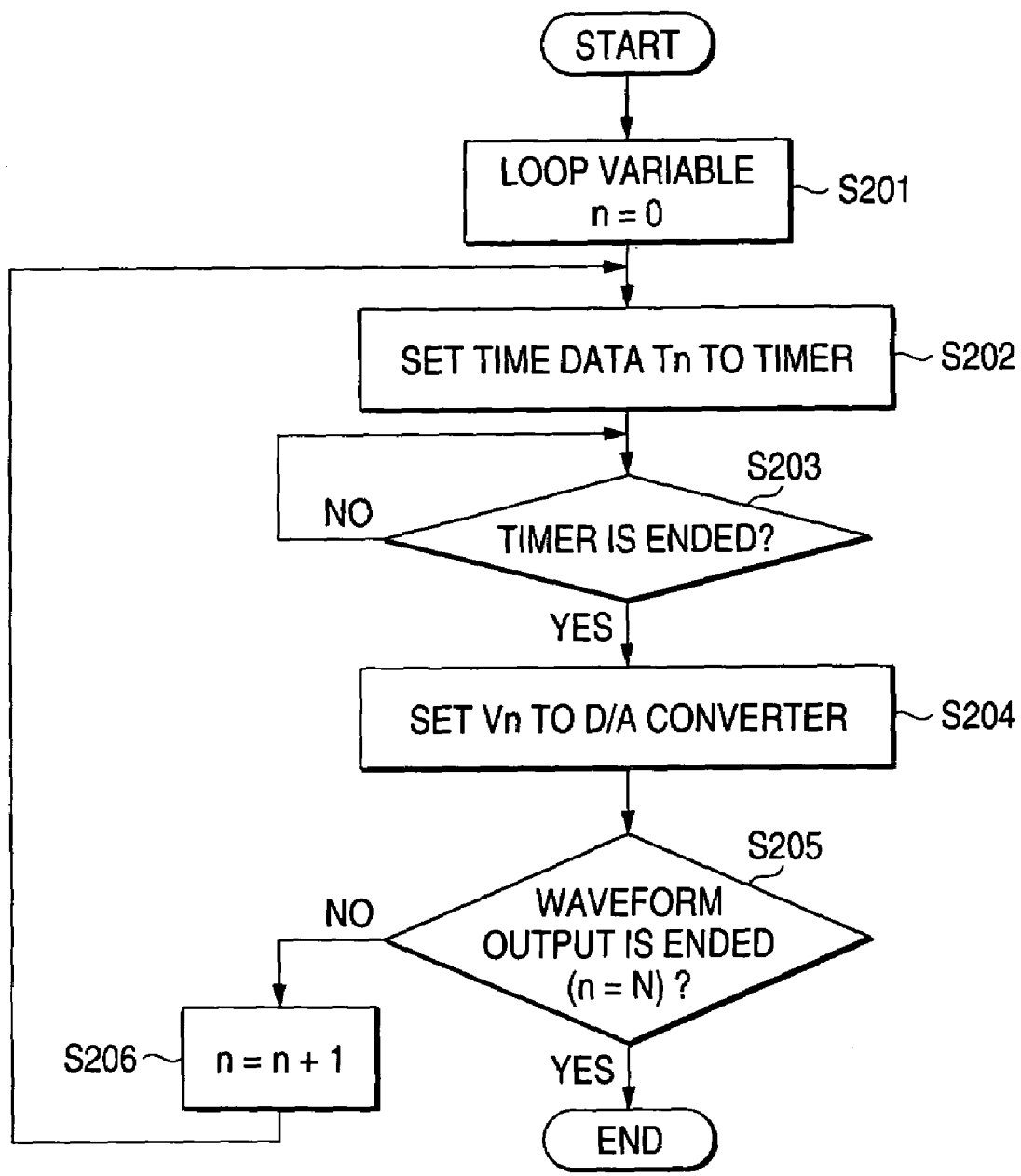
FIG. 9 is a flowchart showing a waveform output processing procedure according to the embodiment 3 of the invention.

Also, FIG. 7(a) shows the contents of the time memory 7 and FIG. 7(b) shows the contents of the waveform memory 2. FIG. 8 shows an explanatory view for obtaining the output time interval from the target waveform. FIG. 9 shows the waveform output processing.

Referring to FIG. 6, the data creation processing will be firstly described.

At step S101, the target waveform is approximated by a plurality of n-th order functions (n: integer) by dividing the waveform at smaller time intervals to make the approximation precision sufficiently high, because it is generally difficult to represent the target waveform with one function. 401 in FIG. 8 is an approximate target waveform approximated by a plurality of linear functions, for example.

$$v=f1(t)=a1 \cdot t+b1 \text{ for } t001 \leq t < t002$$

$$v=f2(t)=a2 \cdot t+b2 \text{ for } t002 \leq t < t003$$

$$v=f3(t)=a3 \cdot t+b3 \text{ for } t003 \leq t < t004$$

...

At step S102, an inverse function of the function generated at step S101 is calculated to acquire the time t for the voltage value that the D/A converter 3 can take.

$$t=(v-b1)/a1 \text{ for } v001 \leq v < v002$$

$$t=(v-b2)/a2 \text{ for } v002 \leq v < v003$$

$$t=(v-b3)/a3 \text{ for } v003 \leq v < v004$$

...

v001, v002, ... are values obtained by substituting tool, t002, ... for the plurality of linear functions.

At step S103, the times t1 to tN for the set voltages v1 to vN of the D/A converter 3 are obtained. The range of the set voltages v1 to vN depends on the range of the target waveform, and the interval of voltage depends on the minimum quantized voltage ΔV of the D/A converter 3. For example, the set voltage is represented by the following function for n=1 to N.

$$vn=v0+\Delta V \cdot n \text{ (}v0 \text{ is the initial value of output voltage of target waveform)}$$

Substituting this function for the inverse function calculated at step S102, the times t1 to tN are obtained. For which inverse function it is substituted depends on an area determination of v1, v2, . . . .

At step S104, the times t1 to tN are converted into time differences T1 to TN for conversion into the output interval of the D/A converter 3.

$$T1=t1$$

$$T2=t2-t1$$

$$T3=t3-t2$$

...

Then, at step S105, the time differences T1 to TN are stored in the time memory 7. At step S106, the set voltages v1 to vN are stored. Zero is set at the top address of the time memory as the initial value, and the initial value v0 of output voltage of target waveform is stored at the top address of the waveform memory 2.

Referring to FIG. 9, the waveform output processing that is another software processing will be described.

First of all, at step S201, the initial value of zero is substituted for the loop variable n.

Then, at step S202, the n-th time data Tn is read from the time memory 7 and set to the timer internally built for the microcomputer 9.

Then, at step S203, the timer is initiated.

Then, at step S204, if a notification of the time elapsed is received from the timer, the n-th waveform data is read from the waveform memory 2, and set to the D/A converter 3. The timer at steps S202 and S203 may be implemented by the software processing for a dummy loop.

Then, at step S205, a determination is made whether or not the waveform output processing is completed. When it is not completed, the procedure goes to step S206, where the loop variable n is counted up.

The data creation processing may not be performed on the same microcomputer 9, but data may be preliminarily created on an external computer and written into the time memory 7 and the waveform memory 2 of the microcomputer 9. Also, when the waveform data is increased at a certain interval, a counter may be employed instead.

Though in this embodiment, the microcomputer is employed to make the software processing for the group of waveform generation features, other computers having the typical computer functions of logical operation and arithmetical operation, such as a personal computer, an office computer, a mini computer and a general-purpose computer, may be also employed.

With this embodiment, the waveform is generated at high precision employing the inexpensive D/A converter with a small number of bits, and the specification changes for the software processing are easily made.

Embodiment 4

Figure 14:
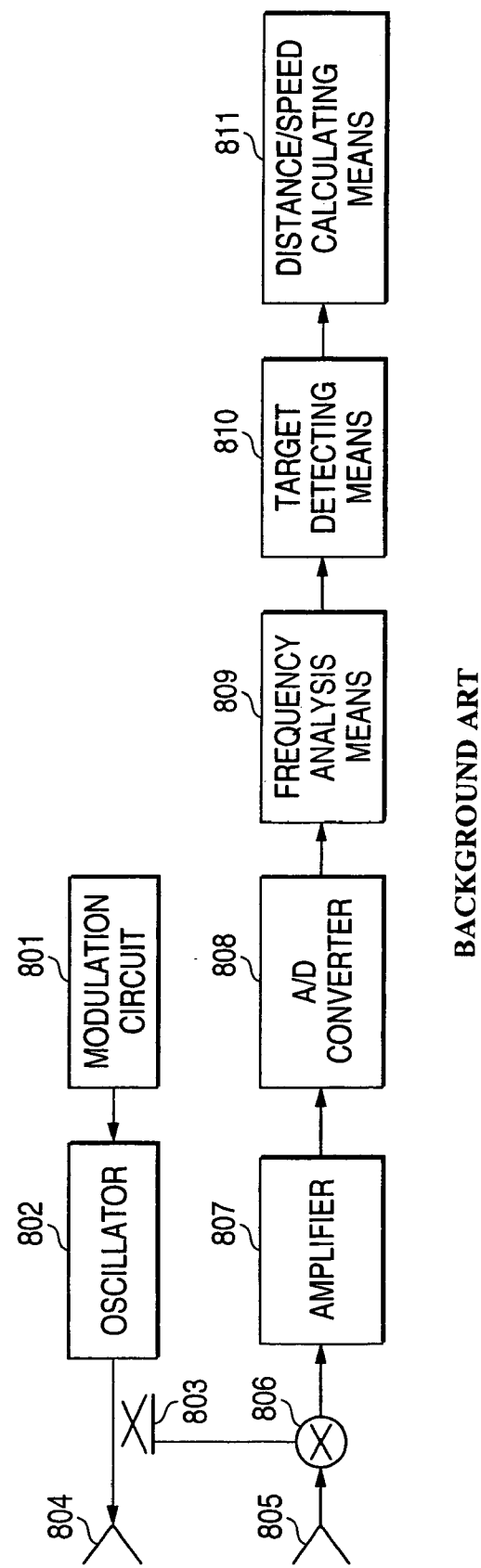
FIG. 14 is a block diagram showing an FM-CW radar apparatus.
Figure 15:
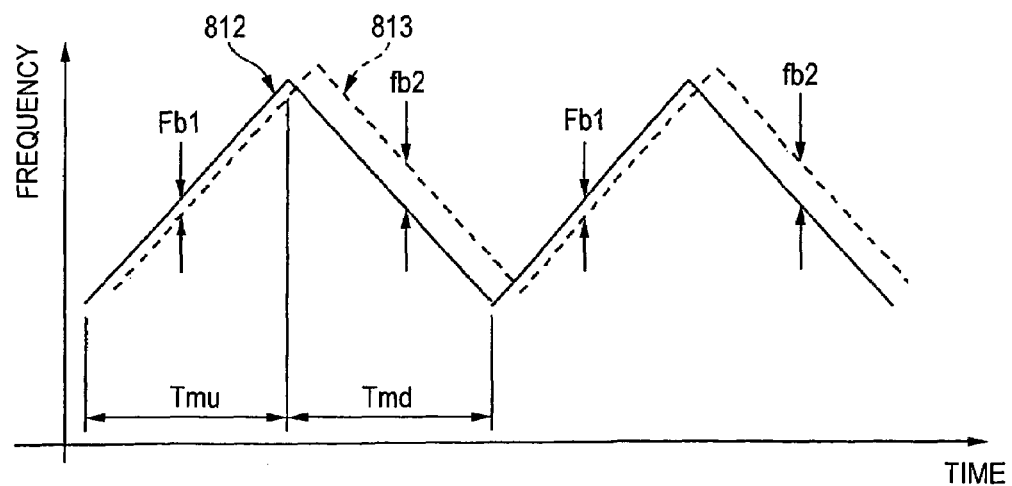
FIG. 15 is a graph showing a transmitting waveform and a receiving waveform for the FM-CW radar apparatus.
Figure 16A:
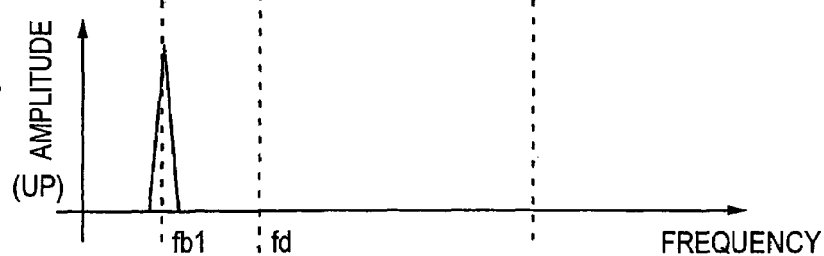
FIGS. 16(a) and 16(b) are graphs showing the frequency spectrum of a beat signal.
Figure 16B:
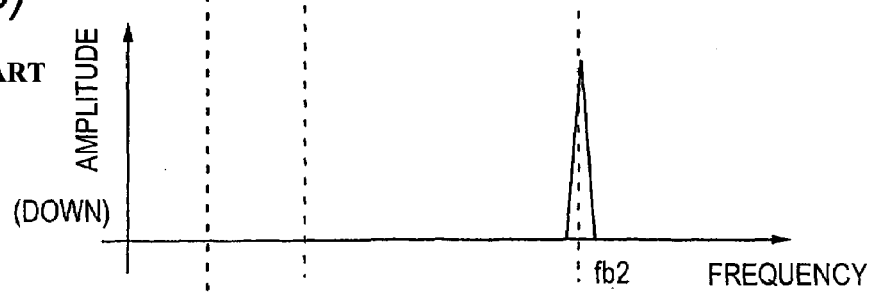
Figure 17A:
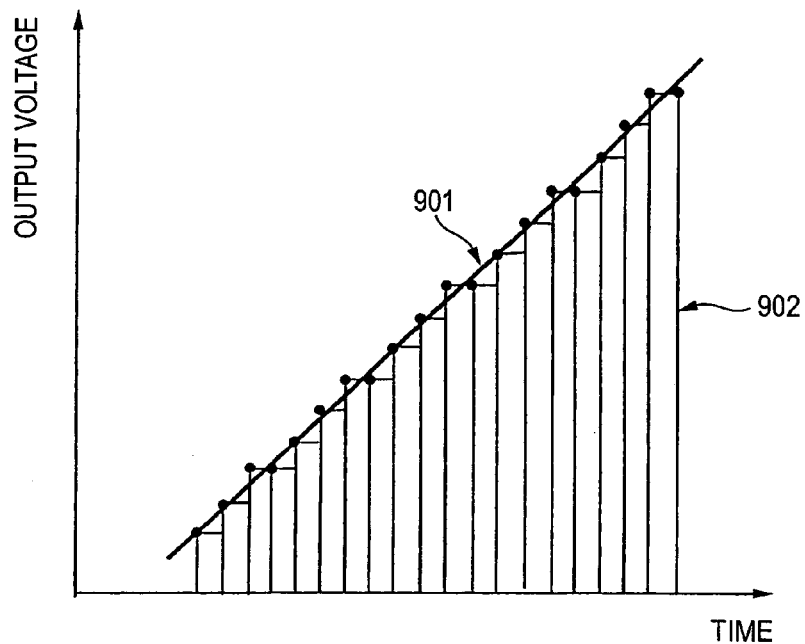
FIGS. 17(a) and 17(b) are graphs for explaining a problem associated with the conventional waveform generation circuit.
Figure 17B:
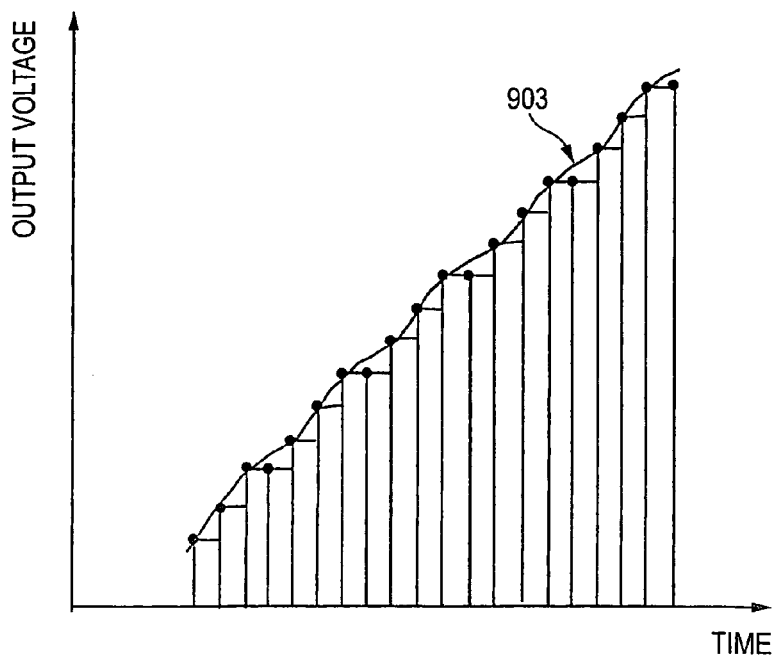
Figure 18A:
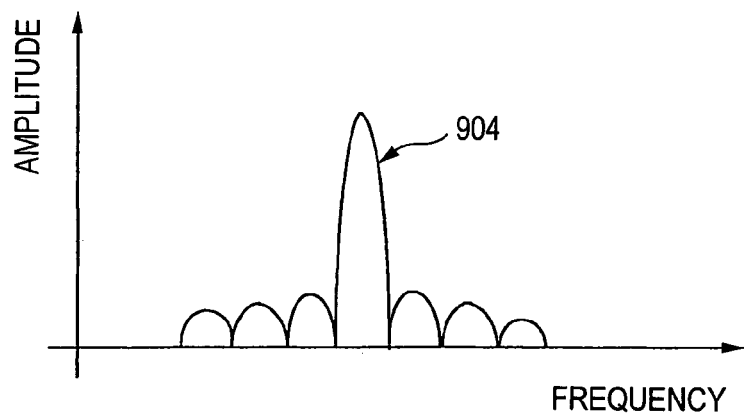
FIGS. 18(a), 18(b) and 18(c) are graphs for explaining a problem associated with the conventional FM-CW radar apparatus.
Figure 18B:
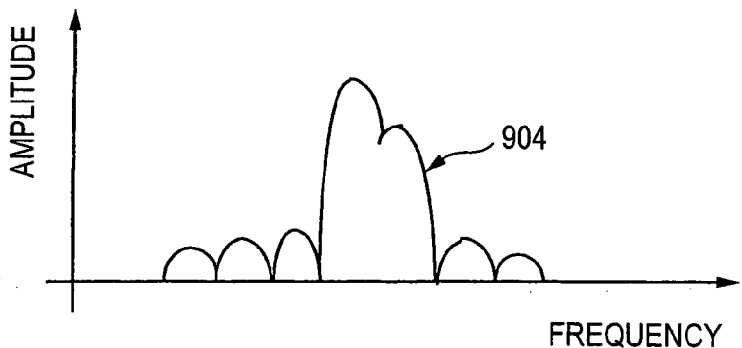
Figure 18C:
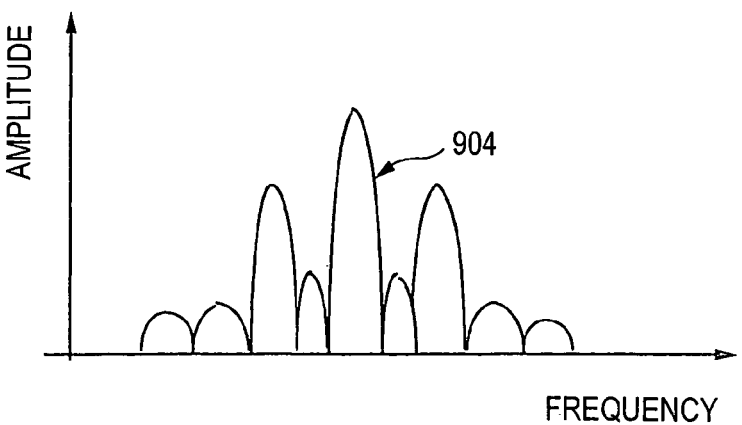

FIGS. 10(a) and 10(b) are graphs showing the modulation waveform according to an embodiment 4 of this invention. In FIG. 10(a), 501 denotes an UP slope waveform of modulation waveform output from a modulation circuit 801 in the FM-CW radar apparatus, and 502 denotes a DOWN slope waveform. The UP slope waveform and the DOWN slope waveform are control waveforms for outputting an UP slope waveform and a DOWN slope waveform respectively. In FIG. 10(b), 503 denotes an output waveform of the D/A converter 3. This modulation waveform is generated by the waveform generation circuit as described in the embodiment 2 or 3. Also, this waveform generation circuit constitutes the modulation circuit 801 of the FM-CW radar apparatus, as shown in FIG. 14. The other constitution or basic operation of the FM-CW radar apparatus has been already described in connection with FIGS. 14 to 16(a) and 16(b), and is omitted here.

For an oscillator of the FM-CW radar apparatus, it is required to apply a control voltage in accordance with the characteristics for each oscillator, because there is typically a non-linear relationship between control voltage (modulation waveform) and oscillation frequency, and also due to individual differences and temperature characteristics. The UP slope waveform 501 and the DOWN slope waveform

Figure 10:
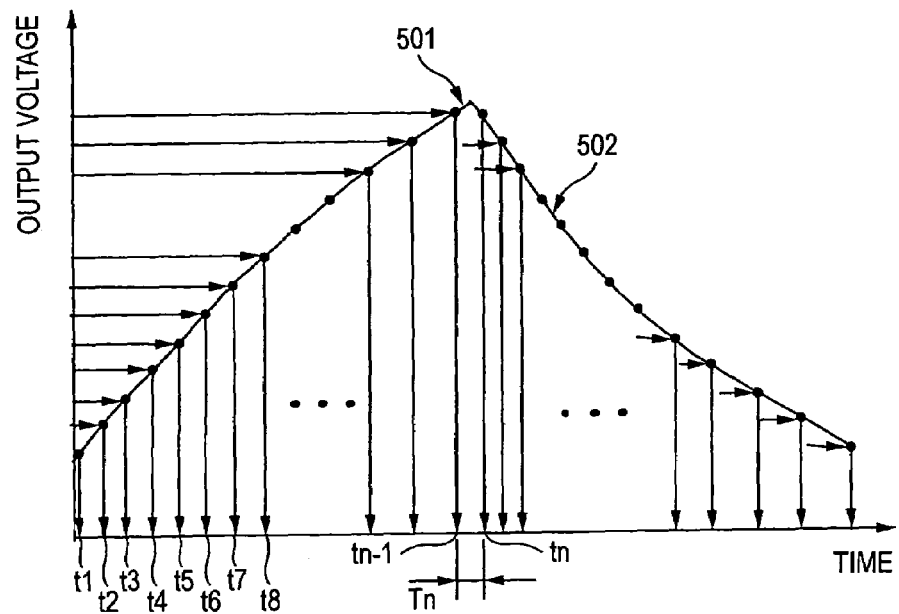
FIGS. 10(a) and 10(b) are graphs showing the modulated waveform of a radar apparatus according to an embodiment 4 of the invention.
Figure 10:
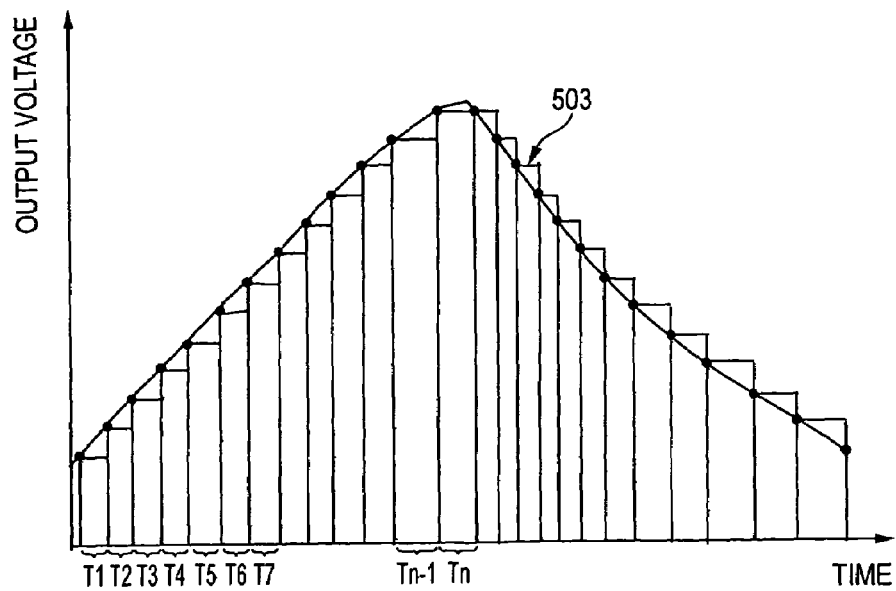
Figure 11:
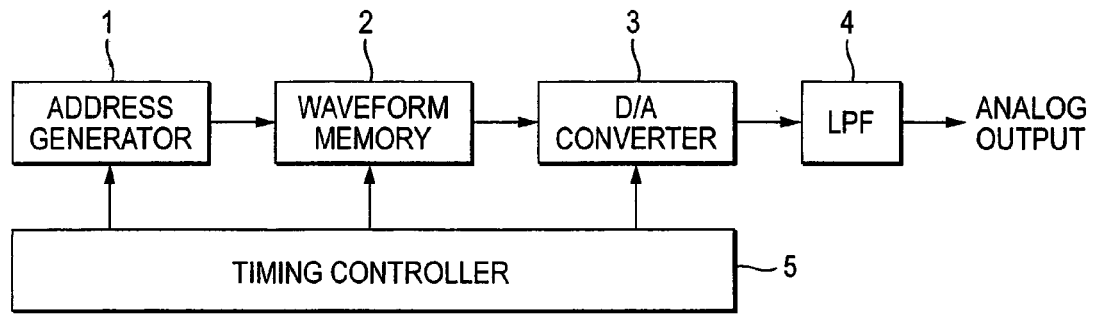
FIG. 11 is a block diagram showing the configuration of the conventional waveform generation circuit.
Figure 12:
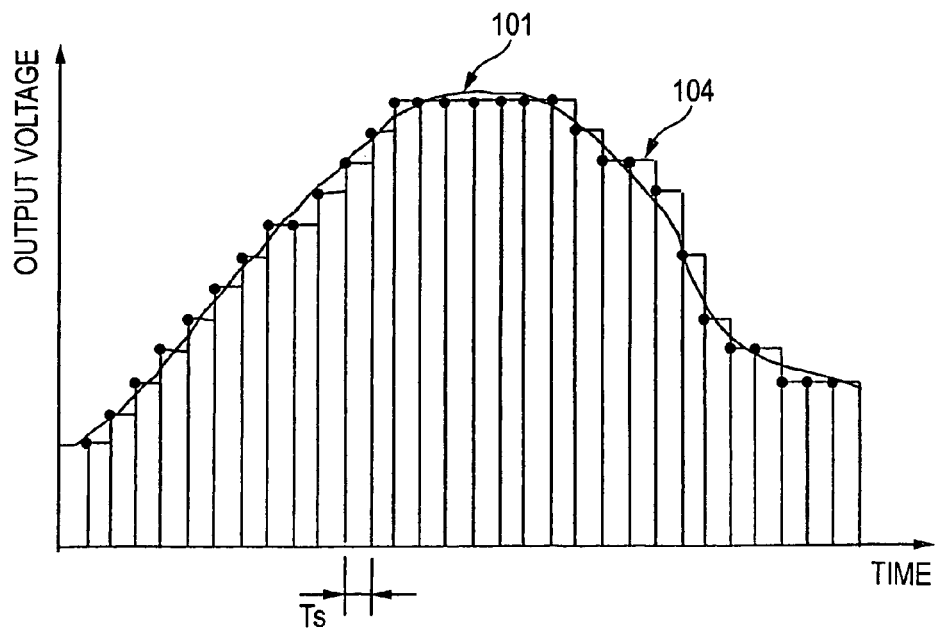
FIG. 12 is a graph showing a waveform generation method for the conventional waveform generation circuit.
Figure 13:
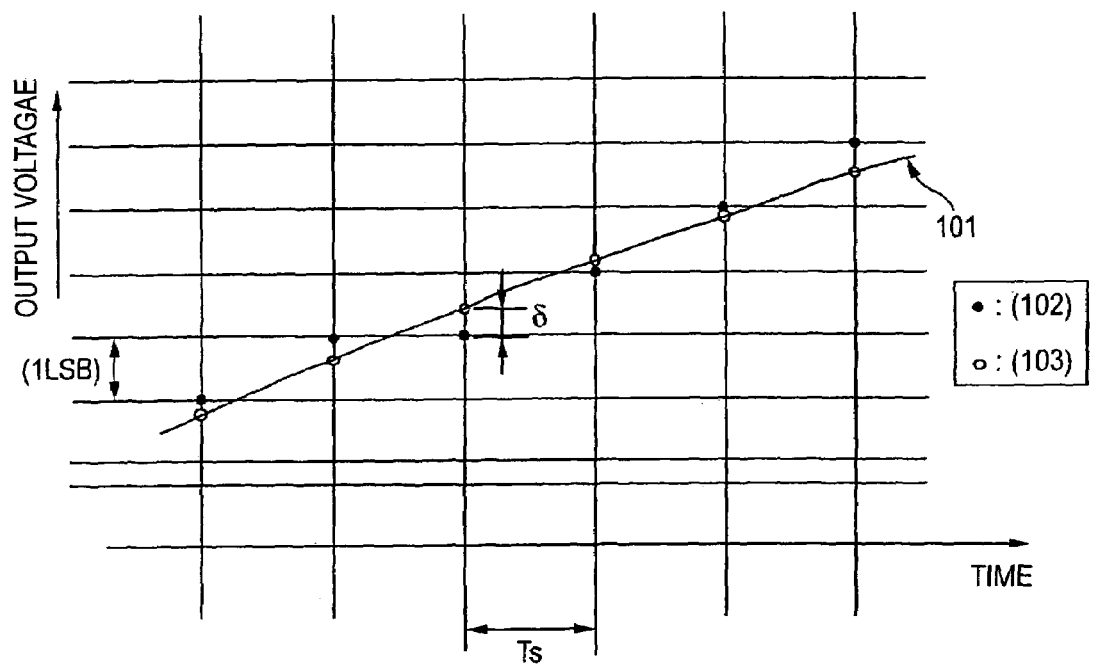
FIG. 13 is a diagram for explaining an error between the target waveform and the D/A converter output in the conventional waveform generation circuit.

502 of FIGS. 10(*a*) and 10(*b*) involve a control voltage waveform output from the modulation circuit 801 and applied to the oscillator. This control voltage waveform is generated to change the frequency linearly. For these waveforms, the output timings t1 to tn (n≦N) at which the quantization error is smaller are obtained, and replaced with the output time intervals T1 to Tn of the D/A converter 3. Though the output time intervals T1 to Tn are unequal, the method for calculating these intervals has been described in the embodiments 1 to 3.

Also, an output voltage is output from the D/A converter 3 at the output time intervals T1 to Tn, whereby the oscillator is linearly oscillated and the frequency spectrum of target object is stabilized even if the control voltage is a micro signal. The waveform output operation of this D/A converter 3 (i.e., waveform generation circuit constituting the modulation circuit 801) is the same as that described in the embodiments 1 to 3.

In this embodiment, the waveform generation circuit as described in the embodiment 2 or 3 is applied as the modulation circuit for modulating the oscillation frequency for the oscillator constituting the FM-CW radar apparatus. As a result, the FM-CW radar apparatus including the small and inexpensive modulation circuit for the oscillator is constituted.

As described above, the waveform generation method, the waveform generation program and the waveform generation circuit according to the invention allow reduction of an error between the target waveform and the output waveform, in contrast to the case of outputting the signal at an equal time interval from the D/A converter to obtain a desired target waveform. Therefore, the FM-CW Radar apparatus including the small and inexpensive modulation circuit for the oscillator is constituted.

The invention claimed is:

1. A waveform generation method for outputting from a D/A converter an output waveform matching a target waveform, comprising:
   varying output values of the D/A converter to match values of the target waveform and varying output timings to match respective output values of the D/A converter with matched values of the target waveform; and
   generating the output waveform from the D/A converter, based on the determined output values and output timings of the D/A converter.

2. The waveform generation method according to claim 1, further comprising:
   filtering between the output values of the D/A converter with a low pass filter provided on an output side of the D/A converter.

3. A method comprising:
   generating waveform data, including
   (a) approximating a target waveform v with at least one function f(t), (b) acquiring times t1, t2, t3, . . . tN corresponding to output voltage values V1, V2, V3, . . . VN of a D/A converter, and
   (c) replacing the times t1, t2, t3, . . . tN with time differences T1, T2, T3, . . . TN between sequential times t1, t2, t3, . . . tN;
   storing the waveform data, including
   (d) storing the time differences T1, T2, T3, . . . TN in the time memory, wherein an initial value T0 of the time differences is zero and stored at a first address value, and
   (e) storing an initial output voltage value V0 of the waveform memory at an a first address value; and
   controlling output timing with the waveform data, including
   (f) substituting an initial value for a loop variable n,
   (g) reading an n-th time data Tn from the time memory and setting the time data Tn in a timer,
   (h) initiating and counting the timer,
   (i) accepting a count end notification from the timer, and setting the output voltage value Vn in the D/A converter, and
   (j) repeating step (g) to step (j) until the loop variable n indicates completion.

4. A waveform generation circuit comprising:
   a time memory configured to store output time intervals of waveform output values preset discretely based on a target waveform, the waveform output values varying to match values of the target waveform, and the output time intervals varying to match respective waveform output values with matched values of the target waveform;
   a timing controller configured to set the times at which D/A conversion of the waveform output values is performed, based on the corresponding output time intervals stored in the time memory; and
   a D/A converter configured to perform D/A conversion of the waveform output values according to the times set in the timing controller.

5. The waveform generation circuit according to claim 4, further comprising:
   a low pass filter configured to filter between output values of the D/A converter.

6. A radar apparatus comprising:
   the waveform generation circuit according to claim 4 as a modulation circuit for modulating the oscillation frequency of an oscillator.

7. A radar apparatus comprising:
   the waveform generation circuit according to claim 5 as a modulation circuit for modulating the oscillation frequency of an oscillator.

8. The waveform generation method according to claim 1, further comprising:
   determining the output timings on the basis of the intersection of the target waveform with plural threshold voltages.

9. The waveform generation method according to claim 8, further comprising:
   determining the threshold voltages on the basis of a minimum resolution of the D/A converter.

10. A signal comprising the waveform generated by the method of claim 1.

11. A signal comprising the waveform generated by the method of claim 2.

12. A signal comprising the waveform generated by the method of claim 8.

13. A signal comprising the waveform generated by the method of claim 9.

14. The method of claim 3, wherein the at least one function f(t) is linear.

15. The method of claim 3, wherein at least some of the time differences T1, T2, T3, . . . TN are different from one another.

16. The method of claim 3, wherein the step (b) includes calculating an inverse of the at least one function f(t).

17. A waveform generation method for outputting from a D/A converter a target waveform, comprising:
   obtaining output values and corresponding output timings for an output waveform of the D/A converter, the output values varying to match values of the target waveform, and the output timings varying to match respective output values with matched values of the target waveform; and generating the output waveform of the D/A converter, based on the output values and output timings of the D/A converter.

18. The waveform generation method according to claim 17, further comprising:
generating the output timings on the basis of the intersection of the target waveform with plural threshold voltages.

19. The waveform generation method according to claim 18, further comprising:
determining the threshold voltages on the basis of a minimum resolution of the D/A converter.

20. A radar device for generating a high frequency signal modulated so as to increase and decrease a change of an oscillation frequency linearly with respect to time, and for transmitting a transmission electronic wave, the radar device comprising:
a time memory;
a waveform memory;
a D/A converter;
an oscillator for generating the modulated high frequency signal based on an output voltage waveform of the D/A converter; and
a microcomputer having stored therein a program to generate a waveform from data previously created and stored in the time memory and the waveform memory according to steps (a) to (f), wherein the microcomputer is configured to cause the waveform to be output in accordance with waveform output processing functions (g) to (k);
(a) approximating a target waveform v with a plurality of functions f1(t), f2(t), f3(t), . . . ;
(b) calculating inverse functions of the plurality of functions f1(t), f2(t), f3(t),
(c) acquiring times t1, t2, t3, . . . tN corresponding to output set-up voltage values V1, V2, V3, . . . , Vn of a D/A converter;
(d) replacing the times t1, t2, t3, . . . tN with time differences T1, T2, T3, . . . TN between a current time and a previous time;
(e) storing the time differences T1, T2, T3, . . . TN in the time memory, wherein an initial value T0 of the time difference is zero and stored at an initial address;
(f) storing the output set-up voltage values V1, V2, V3, . . . in the waveform memory, wherein an initial value V0 of the waveform memory is stored at an initial address;
(g) substitute an initial value of zero for a loop variable n;
(h) read an n-th time data Tn from the time memory and setting the time data Tn in a predetermined timer;
(i) initiate and count the timer;
(j) accept a count end notification from the timer, read an n-th waveform data from the waveform memory, and set the output set-up voltage value Vn in the D/A converter; and
(k) determine a completion status of a waveform output process by confirming the loop variable n, and repeating the processing procedure from (h) to (j) by counting up the loop variable n until completion.

21. An FM-CW radar device that generates a high frequency signal modulated so as to increase and decrease time change of an oscillation frequency linearly with respect to time, and transmits a transmission electronic wave, the FM-CW radar device comprising:

a time memory;
a D/A converter for performing D/A conversion based on an output set-up voltage;
a microcomputer configured to control an output timing of each output set-up voltage of the D/A converter in accordance with functions (a) to (c) employing time data that are discretely stored in the time memory so that the D/A converter outputs a desired output voltage waveform; and
an oscillator for generating the modulated high frequency signal based on the output voltage waveform of the D/A converter;
wherein the time memory stores time differences of each output time in accordance with each output set-up voltage as the time data, according to integral multiples of minimum quantized voltage, using an approximate function of the desired output voltage waveform, and wherein the each output time corresponds to integral multiples of a clock unit in the microcomputer, and
the microcomputer is further configured to
(a) sequentially read the time data in the time memory, and starting to count an elapsed time when the time data is read,
(b) set the output set-up voltage to the D/A converter when the elapsed time counted at the step of (a) reaches the time data, and
(c) repeat functions (a) and (b) for predetermined times.

22. An FM-CW radar device for generating a high frequency signal modulated so as to increase and decrease a change of an oscillation frequency linearly with respect to time, and for transmitting a transmission electronic wave, the FM-CW radar device comprising:
a D/A converter;
a time memory configured to store each output time interval of each waveform output value preset discretely according to a voltage step of a minimum resolution of the D/A converter based on a desired target waveform, which is used in FM-CW modulation;
a timing controller configured to set up a timing at which a D/A conversion of the waveform output values is performed by the D/A converter, based on each output time interval stored in the time memory;
a low pass filter configured to interpolate between output values of the D/A converter; and
an oscillator configured to oscillate the modulated high frequency signal based on the output voltage waveform of the D/A converter.

23. An FM-CW radar device for generating a high frequency signal modulated so as to increase and decrease a time change of an oscillation frequency linearly, and for transmitting a transmission electronic wave, the FM-CW radar device comprising:
a D/A converter configured to perform a D/A conversion based on an output set-up voltage;
a time memory configured to store each output time interval of each output set-up voltage preset discretely according to integral multiples of a minimum quantized voltage of the D/A converter to output a desired target waveform, which is used in the FM-CW modulation;
a timing controller configured to set up a timing at which a D/A conversion of the output set-up voltage is performed by the D/A converter, based on each output time interval stored in the time memory;
a low pass filter configured to smooth the output waveform of the D/A converter; and an oscillator configured to oscillate the modulated high frequency signal based on output voltage waveform of the D/A converter.

24. The method according to claim 3, wherein the step of (a) approximating further comprises:

approximating the target waveform v with a plurality of functions.

25. The method according to claim 3, wherein the step of (e) storing further comprises:

storing the output voltage values V1, V2, V3, ... VN in the waveform memory.

26. The method according to claim 25, wherein the step of (i) accepting further comprises:

reading an n-th waveform data from the waveform memory.

* * * * *